United States Patent [19]

Schenz

[11] Patent Number: 5,747,139
[45] Date of Patent: May 5, 1998

[54] COMPONENT CARRIER TAPE

[75] Inventor: James L. Schenz, Baytown Township, Washington County, Minn.

[73] Assignee: Minnesota Mining and Manufacturing Company, St. Paul, Minn.

[21] Appl. No.: 590,857

[22] Filed: Jan. 24, 1996

[51] Int. Cl.⁶ ................................................. B65D 85/90
[52] U.S. Cl. .................. 428/120; 428/131; 206/710; 206/713; 206/714; 206/717; 53/450
[58] Field of Search .................... 428/120, 131, 428/906; 206/714, 713, 710, 717; 53/450

[56] References Cited

U.S. PATENT DOCUMENTS

| | | | |
|---|---|---|---|
| 3,417,865 | 12/1968 | Claus et al. | 206/46 |
| 4,702,788 | 10/1987 | Okui | 156/252 |
| 4,736,841 | 4/1988 | Kaneko et al. | 206/332 |
| 5,085,321 | 2/1992 | Chew | 206/331 |
| 5,089,314 | 2/1992 | Masujima et al. | 428/156 |
| 5,119,934 | 6/1992 | Karasawa et al. | 206/330 |
| 5,199,564 | 4/1993 | Skrtic | 206/330 |
| 5,203,143 | 4/1993 | Gutentag | 53/452 |
| 5,259,500 | 11/1993 | Alvite et al. | 206/330 |
| 5,351,821 | 10/1994 | Skrtic | 206/330 |
| 5,361,901 | 11/1994 | Schenz et al. | 206/330 |
| 5,390,472 | 2/1995 | Weiler et al. | 53/412 |
| 5,472,085 | 12/1995 | Gelzer | 206/174 |

FOREIGN PATENT DOCUMENTS

| | | | |
|---|---|---|---|
| 05 305985 A | 11/1993 | Japan | B65D 85/38 |
| 5305985 | 11/1993 | Japan | 206/330 |

Primary Examiner—Alexander Thomas
Attorney, Agent, or Firm—Michaele A. Hakamaki

[57] ABSTRACT

A flexible carrier tape used for protecting components while they are being transported, wherein the carrier tape comprise a strip portion having a component-receiving surface and first and second longitudinal edge surfaces. At least two side walls having inner and outer major surfaces extend upwardly from the component-receiving surface between the longitudinal edge surfaces forming at least one component-receiving area. The inner major surface of at least one side wall is inclined inwardly toward the component-receiving area, forming an angle greater than 0 degrees but less than 90 degrees with the component-receiving surface of the carrier tape. When a component is placed in the component-receiving area, the inclined inner major surface advantageously exerts a force on the component that prevents the component from moving within or falling out of the component-receiving area. This obviates the need for an adhesive or cover tape to hold the component in place, and minimizes the possibility of contamination by adhesive residue and damage to the components by static electricity created by removal of the cover tape or movement of the components.

24 Claims, 6 Drawing Sheets

5,747,139

COMPONENT CARRIER TAPE

FIELD OF THE INVENTION

This invention relates generally to carrier tapes of the kind used to transport components from a component manufacturer to a different manufacturer that assembles the components into new products. More specifically, this invention relates to carrier tapes for storing electronic surface mount components and for supplying those components seriatim to a machine. The carrier tape advantageously obviates the need to use an adhesive or cover tape to secure the components in place.

BACKGROUND OF THE INVENTION

In the field of electronic circuit assembly, it is common to use robotic placement equipment to move electronic components such as resistors, capacitors or integrated circuits from a supply source to a circuit board for attachment in a specific location thereto. After attachment, the circuit board may be further incorporated into an electronic device, for example, a computer.

Robotic placement equipment is typically programmed to repeat a precise sequence of movements in every cycle. For example, the robotic equipment may be programmed to grasp an electronic component and place it in a specific orientation and location on a circuit board. This sequence of picking up a component and placing it on a circuit board may be performed on each circuit board that needs such a component at the particular location. The robotic placement equipment operates most efficiently when a continuous supply of components is available for the robot to easily grasp at a precise location during each cycle.

Many times the components supplied to robotic placement equipment are somewhat fragile and may be easily damaged (e.g., scratched or crushed) by even minimal physical contact. In fact, some components are so sensitive that any unnecessary contact with the component can make the component unusable. To prevent this damage, it is desirable for components to be protected from physical contact while being transported from the component manufacturer, during any time the components are in storage, and during the assembly process until the robotic placement equipment grasps the component.

A common way to supply components to robotic placement equipment is by using a carrier tape comprising a series of pockets sized to protectively accommodate the components. The component manufacturer typically loads the components into the pockets, secures the components therein with a cover tape to prevent the components from falling out, and winds the loaded carrier tape into a roll or onto a reel. The loaded carrier tape may then be transported to an assembler where the roll or reel is unwound and advanced toward the robotic placement equipment. As the carrier tape advances, the robotic placement equipment removes the cover tape and repetitively picks up a component from a pocket and places it in a desired location.

One type of carrier tape is known as a punched carrier tape, examples of which are described in U.S. Pat. Nos. 4,702,788 (Okui) and 5,203,143 (Gutentag). The pockets of the punched carrier tapes are typically formed by die punching a series of holes through a strip of material (such as paper) having a thickness corresponding to the depth of the pockets to be formed. An adhesive strip is often adhered to bottom side of the strip of material so that some portion of the adhesive is exposed to the inside of the pocket, thereby creating an adhesive surface for securing a component in position inside the pocket. To use a punched carrier tape, one component is typically placed on the adhesive surface in each pocket, over which a cover strip may be affixed.

One drawback of punched tapes is that the process of punching holes into the strips of material often creates residual particulates which may remain in the pockets or on the face of the carrier tape. These particulates can contaminate components that are placed in the pockets, may obstruct the small vacuum orifices of some robotic equipment, or may otherwise interfere with the ability of the robotic equipment to recognize and grasp components.

Another drawback of punched tapes is that they oftentimes are subject to variations in width and thickness due to changes in humidity. This can cause registration problems with the feeding mechanism of the robotic placement equipment.

Another type of carrier tape that may be used to transport components is known as an embossed carrier tape. Examples of such carrier tapes are described in U.S. Pat. Nos. 4,7366,841 (Kaneko et al.) and 5,089,314 (Masujima et al.). Typically, these tapes are prepared by embossing a material (such as a polymeric material) to provide identical pockets that are uniformly spaced along the length of the tape. Once the components are loaded into the pockets of the carrier, a cover strip may be affixed over the pockets to keep the components from falling out of the carrier. Alternatively, an adhesive may be placed into each pocket for securing components within the pockets. The application of adhesive into each pocket requires the use of equipment that is sufficiently sophisticated to properly index the carrier tape and accurately place adhesive within each pocket. Furthermore, the adhesive may contaminate components with an adhesive residue.

The foregoing discussion illustrates that conventional carrier tapes typically require the use of an adhesive or cover tape to prevent components from moving about or falling out of the pockets of the tape. In addition to the drawbacks already described above, such items add cost (for example, raw material costs and cost associated with additional processing steps) to the overall price of the loaded carrier tape. Furthermore, the process of removing the cover tape from the carrier tape can generate sufficient static electricity to damage components. It would therefore be advantageous to provide a carrier tape that does not require either an adhesive or cover tape to hold components in place once they are loaded onto a carrier. Preferably, such a carrier tape would also be resistant to dimensional changes cause by changes in humidity and could be manufactured using a method that does not produce particulates.

SUMMARY OF THE INVENTION

In one embodiment, the present invention relates to a flexible carrier tape used for securing and protecting components while they are being transported. The carrier tape comprises a strip portion having a component-receiving surface and first and second longitudinal edge surfaces. At least two side walls extend upwardly from the component-receiving surface between the longitudinal edge surfaces and are longitudinally disposed along the length of the carrier tape. A component-receiving area comprises that area of the strip portion bordered by the at least two side walls. At least one of the two side walls is inclined inwardly toward the component-receiving area, forming an angle greater than 0 degrees but less than 90 degrees with the component-receiving surface of the carrier tape. Preferably, both of the side walls are inclined inwardly toward the component-receiving area, forming angles greater than 0 degrees but less than 90 degrees with the component-receiving surface of the carrier tape.

A component may be loaded into the carrier tape of the present invention in a variety of ways. In general, loading requires that at least one inclined side wall be displaced to a position in which the side walls are sufficiently spread apart to permit insertion of a component into the component-receiving area. Once the component is inserted into the component-receiving area, the displaced side wall recovers to a component-securing position wherein the component resides underneath a portion of at least one inclined side wall. Preferably, the component resides underneath a portion of two inclined side walls. More preferably, each of the two inclined side walls contacts and exerts a downward force onto the top of the component that is sufficient to hold the component in place without damaging the component. In this embodiment, it is possible to secure a component within the component-receiving area so that the component is unable to move.

Thus, the present invention obviates the need for an adhesive or cover tape to secure a component into a carrier tape, and minimizes the possibility of contamination by adhesive residue and damage to the components by static electricity created by removal of the cover tape or movement of the components.

A component may be removed from the carrier tape of the invention using techniques similar to those used for inserting a component. These techniques generally involve displacing at least one inclined side wall to a position in which the walls are sufficiently spread apart to permit removal of a component from the component-receiving area. Alternatively, a mechanical push-up device (such as a poke-up needle) or a vacuum suction device may be used alone or in combination to lift the component from the component-receiving area.

In another embodiment of the present invention, a component-receiving area comprises that area of the strip portion bordered by the an end wall in addition to at least two side walls. An end wall is positioned in the transverse direction of the carrier tape, typically forming an angle in the range of 45 to 135 degrees, inclusively, with a longitudinal edge surface of the carrier tape. Preferably, the outer major surface of each end wall is substantially perpendicular to a longitudinal edge surface (i.e., forms an angle between 85 and 95 degrees therewith).

An end wall may be inclined inwardly toward or outwardly away from the component-receiving area. Alternatively, an end wall may be substantially perpendicular to the component-receiving surface of the carrier tape (i.e., forming an angle between 85 and 95 degrees therewith). End walls may be advantageously used to provide additional security against movement of the components, especially movement in the longitudinal direction of the carrier tape.

Another embodiment of the present invention provides a method of securing at least one component into a carrier tape without the need for a cover tape or adhesive. The method comprises the steps of providing a carrier tape of the invention, displacing the inclined side wall(s) to a component-receiving position, and loading at least one component therein. Another embodiment of the present invention provides a method of removing a component from a loaded carrier tape of the present invention. The method comprises the steps of providing a loaded carrier tape of the invention, displacing at least one inclined side wall to a position in which the side walls are sufficiently spread apart to permit removal of the component, and removing the component.

The carrier tape of the present invention is particularly well-suited for protecting components during transportation to and use by robotic placement equipment. In addition to the advantages described previously, the carrier tape of the present invention is advantageously resistant to dimensional changes caused by changes in humidity and can be manufactured using a method that does not produce particulates.

The carrier tape of the present invention may be conveniently wound around a core for subsequent storage and transportation. Preferably, when the carrier tape is to be wound around a core, the outer major surface of each side wall forms an angle less than 45 degrees or greater than 135 degrees with a longitudinal edge surface of the tape. In this case, the inwardly inclined inner major surfaces of the side walls have a slight tendency to further bend inwardly due to the forces that result from winding the carrier tape. This advantageously allows the components to be snugly stored in the component-receiving areas without shifting or falling out of the carrier tape.

BRIEF DESCRIPTION OF THE DRAWINGS

The present invention will be more fully appreciated with reference to the following drawings in which similar reference numerals designate like or analogous components throughout and in which.

DETAILED DESCRIPTION OF THE INVENTION

Figure 1:
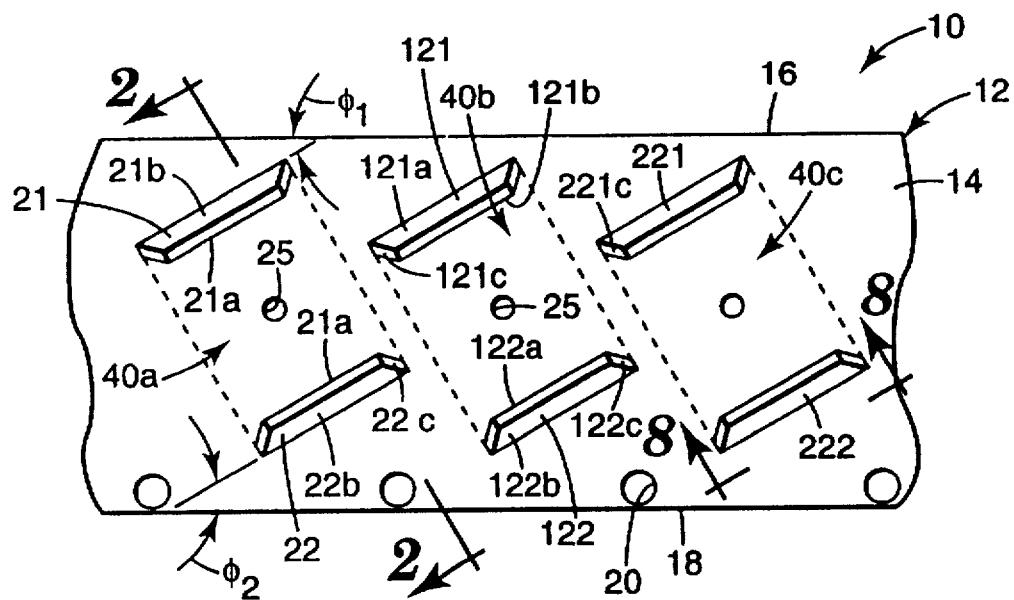
FIG. 1 is a fragmentary plan view of one embodiment of a carrier tape according to the invention.

Referring now to the drawings, and initially to FIG. 1, a first embodiment of a carrier tape 10 according to the present invention is shown. Carrier tape 10 may be used to transport components (e.g., electronic components such as surface mount components including but not limited to resistors, memory chips, integrated circuits, and capacitors) from a component manufacturer to a different manufacturer that removes the components from the carrier tape and assembles the components into new products. Carrier tapes are commonly used in conjunction with automated assembly equipment, where an advancement mechanism automatically advances the carrier tape so that robotic placement equipment can sequentially remove components from the carrier tape and place the components in another location, such as a specific location on a circuit board.

Although carrier tape 10 is particularly suitable for use in automated processes, the carrier tape may be used in semi-automated processes where the loaded carrier tape is advanced by automated equipment and an operator (as opposed to a robot) removes the components from the carrier tape. It is also contemplated that the carrier tape may be used in a completely manual system, where the loaded carrier tape is not used in conjunction with any type of automated equipment. Instead, the operator manually removes a component from the carrier tape and then manually advances the carrier tape so that the next component may be removed.

According to a preferred embodiment, carrier tape 10 comprises an elongated strip portion 12 defining a component-receiving surface 14. Component-receiving surface 14 is the surface of the carrier tape 10 on which components may be loaded and stored. Strip portion 12 includes longitudinal edge surfaces 16 and 18 on opposite sides of strip portion 12, which are preferably parallel to each other. Strip portion 12 may include an optional row of advancement holes 20 formed in strip portion 12 and extending in a row spaced inwardly from longitudinal edge surface 18. An optional second row (not shown) of advancement holes may be spaced inwardly from the other longitudinal edge surface 16. Advancement holes are typically sized and spaced to engage with a specific advancement mechanism. The advancement mechanism may comprise, for example, one sprocket for each row of advancement holes 20, where the teeth of each sprocket engage advancement holes 20 to advance carrier tape 10 toward a predetermined location so that the robotic placement equipment may either place the components on the carrier tape or remove components from the carrier tape.

At least two side walls, 21 and 22, extend upwardly from component-receiving surface 14 of strip portion 12 of the carrier tape 10. Side walls 21 and 22 are spaced inwardly from opposite longitudinal edge surfaces 16 and 18, respectively. Side wall 21 comprises inner major surface 21a and outer major surface 21b. Side wall 22 comprises inner major surface 22a and outer major surface 22b.

A component-receiving area 40a comprises that area of the strip portion 12 bordered by the at least two side walls 21 and 22. At least one of the inner major surfaces 21a and 22a is inclined inwardly toward component-receiving area 40a. Preferably, both inner major surfaces 21a and 22a are inclined inwardly toward the component-receiving area 40a, forming an angle greater than 0 degrees but less than 90 degrees with the component-receiving surface 14 of carrier tape 10.

Preferably, a plurality of pairs of side walls 21 and 22 are present on the carrier tape 10 of the present invention. Preferably, the pairs are present in a uniformly repeating pattern as shown in FIG. 1. In this uniformly repeating pattern, each pair of walls 21 and 22 is spaced an equal distance from an adjacent pair of walls 121 and 122. Furthermore, the inner and outer major surfaces 21a and 21b of one side wall 21 in a first pair of side walls (21 and 22) are parallel to the inner and outer major surfaces 121a and 121b of an adjacent side wall 121 in a second pair of side walls (121 and 122).

It is noted that while there are only two side walls 21 and 22 per component-receiving area 40a in FIG. 1, edges of certain side walls can serve as retaining surfaces for adjacent component-receiving areas. For example, edge wall 121c of side wall 121 can serve as a retaining surface for component-receiving area 40a. Similarly, edge wall 221c of side wall 221 can serve as a retaining surface for component-receiving area 40b.

Figure 2:
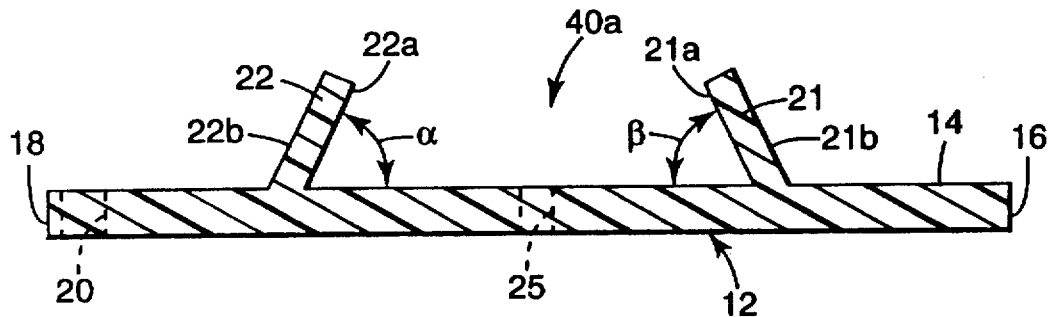
FIG. 2 is a sectional view taken along lines 2—2 of FIG. 1.

FIG. 2 illustrates a sectional view taken along lines 2—2 of FIG. 1 showing a preferred embodiment of the present invention where the inner major surfaces 21a and 22a of each side wall 21 and 22, respectively, are inclined inwardly toward the center of the component-receiving area 40a, forming angles, β and α, respectively, with the component-receiving surface 14 of the carrier tape 10. The values of α and β are greater than 0 degrees but less than 90 degrees, more preferably greater than 45 degrees but less than 90 degrees, even more preferably greater than 60 degrees but less than 90 degrees, most preferably greater than 80 degrees but less than 90 degrees. The values of α and β may be the same or different. Preferably, they are the same.

The component may be loaded into the carrier tape in a variety of ways. In general, loading requires that at least one inclined side wall be displaced to a position in which the walls are sufficiently spread apart to permit insertion of a component. Once the component is inserted into the component-receiving area, the displaced side wall recovers to a component-securing position wherein the component resides underneath a portion of at least one inclined side wall. Preferably, the component resides underneath a portion of two inclined side walls. More preferably, each of the two inclined side walls contacts and exerts a downward force onto the top of the component that is sufficient to hold the component in place without damaging the component. In this embodiment, it is possible to secure a component within the component-receiving area so that the component is unable to move.

Figure 3:
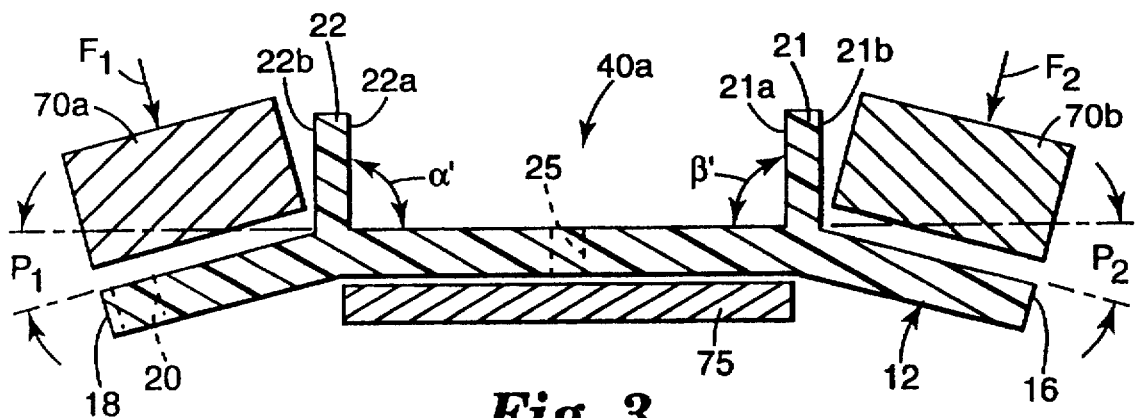
FIG. 3 is a sectional view similar to FIG. 2 wherein the side walls have been displaced to a position in which the walls are sufficiently spread apart to permit insertion (or removal) of a component.

FIG. 3 shows a view similar to FIG. 2 wherein the side walls 21 and 22 have been displaced to a position in which the walls are sufficiently spread apart to permit insertion of a component. In FIG. 3, displacement of side walls 21 and 22 has been accomplished by exerting downward forces $F_1$ and $F_2$ on each longitudinal edge surface 18 and 16, respectively, of the carrier tape 10 which causes the side walls 21 and 22 to open. The downward forces $F_1$ and $F_2$ are applied by members 70a and 70b. The downward forces $F_1$ and $F_2$ cause longitudinal edge surfaces 18 and 16, respectively, to shift downward from their original positions.

The amount of downward shift for each longitudinal edge surface 18 and 16 is denoted by $P_1$ and $P_2$, respectively, in FIG. 3. Typically, the component-receiving area 40a rests on support surface 75 during deflection of side walls 21 and 22. The values of $\alpha'$ and $\beta'$ are sufficiently large to permit a component to be inserted into component-receiving area 40a. Typically, the values of $\alpha'$ and $\beta'$ are 90 degrees in the component-receiving position.

It is also possible to replace support surface 75 of FIG. 3 with a surface comprising a radius which causes the component-receiving area to bow upward. This in turn causes the side walls to flex open without the need for downward forces $F_1$ and $F_2$.

Figure 3A:
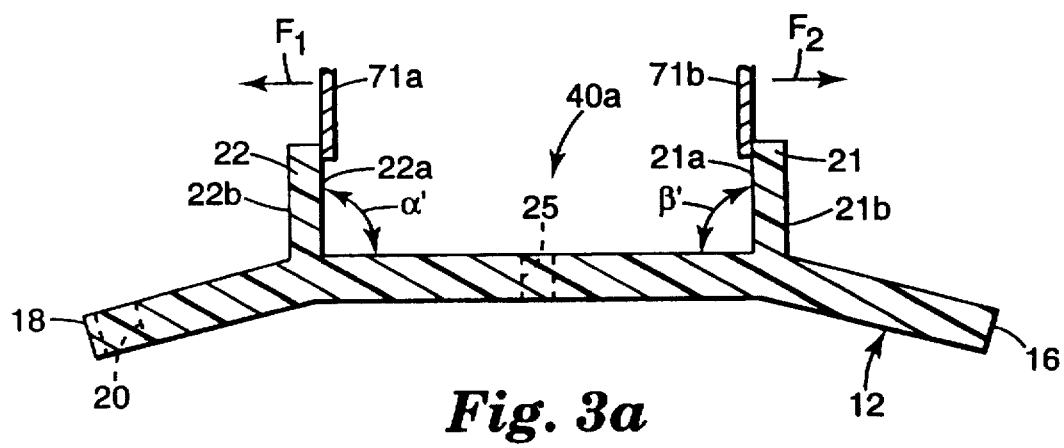
FIG. 3a is a sectional view similar to FIG. 3 wherein a tool has been used to displace the side walls to a position in which the walls are sufficiently spread apart to permit insertion (or removal) of a component.

FIG. 3a illustrates a view similar to FIG. 3 wherein two arms 71a and 71b have been used to displace side walls 22 and 21. The two arms 71a and 71b engage the inner surfaces 22a and 21a, respectively, and exert forces $F_1$ and $F_2$ which cause the side walls to flex open.

Figure 4:
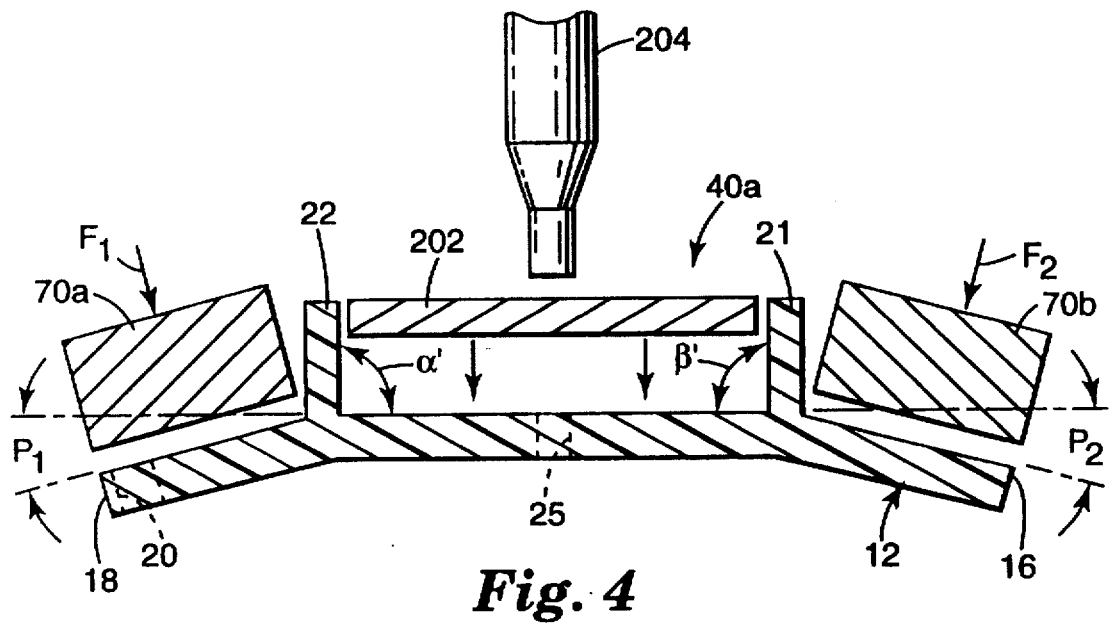
FIG. 4 is a sectional view similar to FIG. 3 showing the insertion of a component into the component-receiving area by a loader.

FIG. 4 is a sectional view similar to FIG. 3 showing the insertion of component 202 into the component-receiving area 40a using loader 204, while the side walls 21 and 22 are in a component-receiving position. Once the component is in the component-receiving area, forces $F_1$ and $F_2$ are removed, whereupon side walls 21 and 22 recover to a component-securing position.

Figure 5:
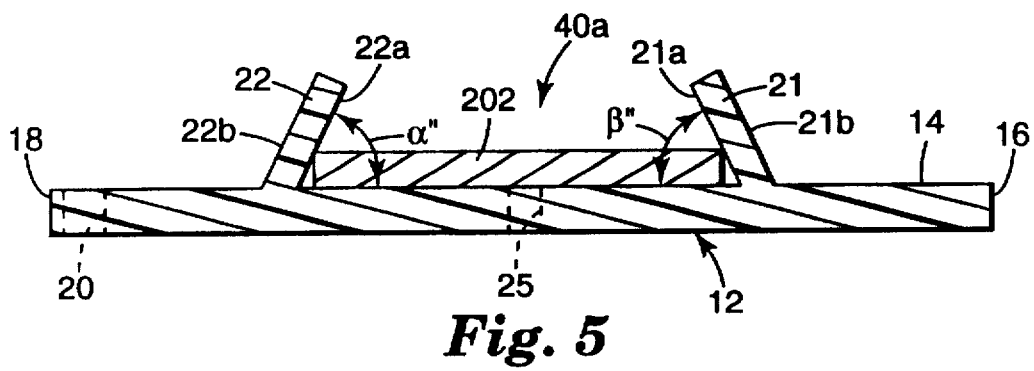
FIG. 5 is a sectional view similar to FIG. 4 showing a component retained in the component-receiving area.

FIG. 5 illustrates a sectional view similar to FIG. 4 showing the component 202 after it has been loaded into component-receiving area 40a, and side walls 21 and 22 have recovered to a component-securing position. In this position, the component 202 resides underneath a portion of each inclined inner major surface 21a and 22a and is thereby prevented from falling out of the component-receiving area 40a. The inner major surfaces 22a and 21a form angles $\alpha''$ and $\beta''$, respectively, with component-receiving surface 14. The values of $\alpha''$ and $\beta''$ in FIG. 5 (with a component) may be the same or different than the values of $\alpha$ and $\beta$ in FIG. 2 (without a component). Preferably, the values of $\alpha''$ and $\beta''$ are slightly greater than the values of $\alpha$ and $\beta$. In this case, inclined inner major surfaces 21a and 22a contact and exert a downward force onto the top of the component 202. In this embodiment, it is possible to secure 202 component within the component-receiving area 40a so that the component is unable to move without the need for an adhesive or cover tape.

Figure 6A:
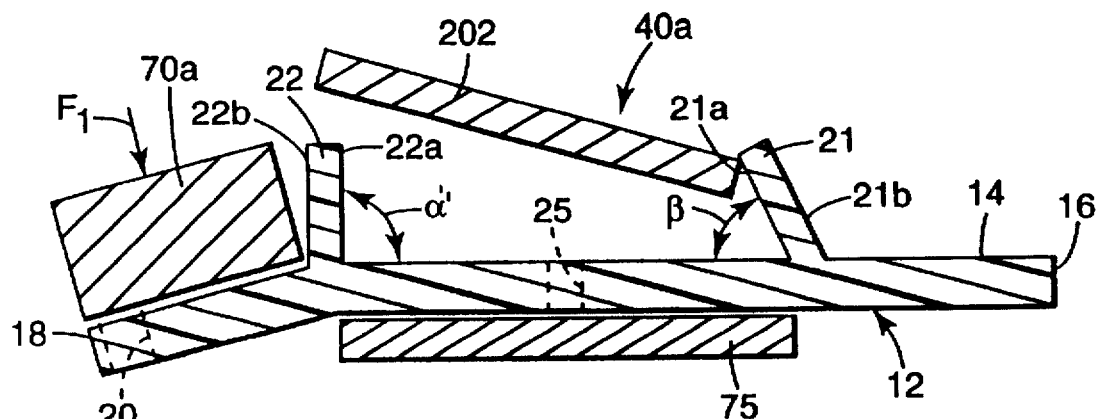
FIGS. 6a–6c are sectional views similar to FIG. 4 demonstrating the insertion of a component into a component-receiving area by displacing only one of the inclined side walls.
Figure 6B:
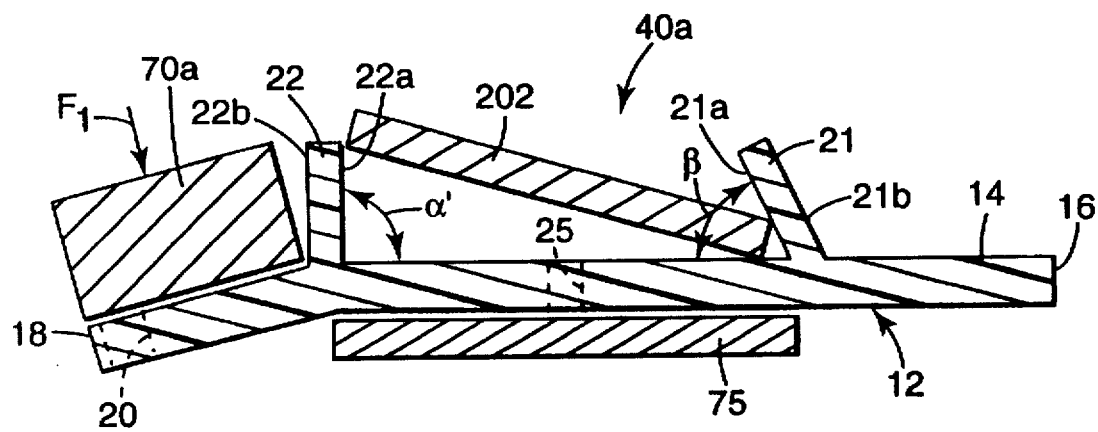
Figure 6C:
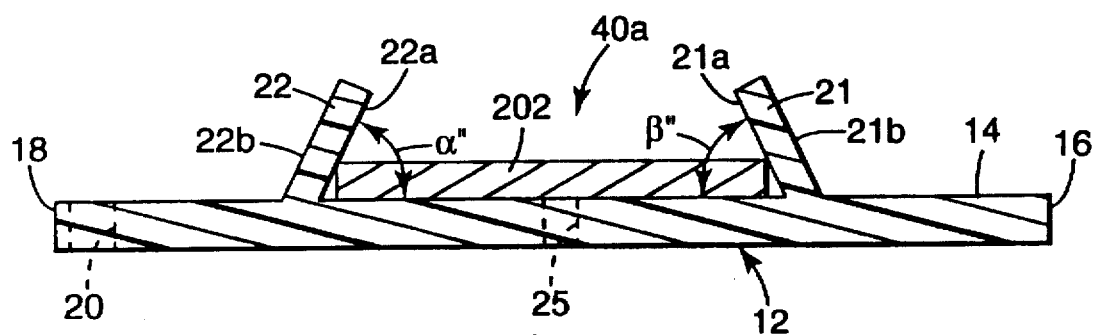

Components may also be loaded into a component-receiving area by displacing only one (instead of both) side walls. This is illustrated in FIGS. 6a–6c. In FIG. 6a, side wall 22 has been flexed open by applying a downward force $F_1$ on longitudinal edge surface 18. Component 202 is then presented to component-receiving area 40a at an angle to side wall 21.

FIG. 6b illustrates a transitional position of component 202 before it reaches its final secured position in component-receiving area 40a.

FIG. 6c illustrates component 202 in a secured position in component-receiving area 40a. Downward force $F_1$ has been removed, allowing side wall 22 to recover to a component-securing position.

A component 202 may be removed from the carrier tape 10 of the invention using techniques similar to those used for inserting a component. These techniques generally involve displacing at least one inclined side wall to a position in which the walls are sufficiently spread apart to permit removal of a component from the component-receiving area.

Figure 7:
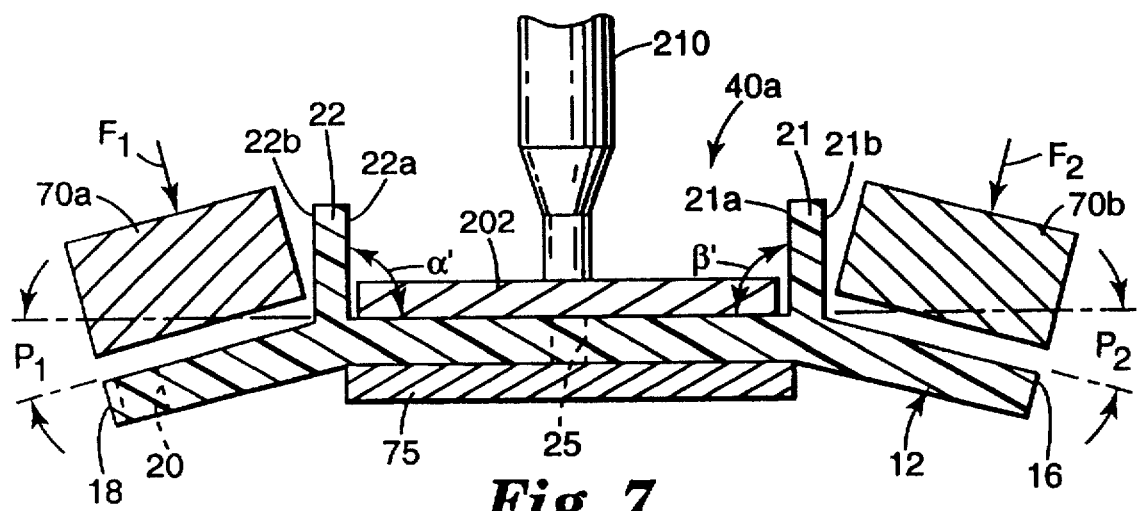
FIG. 7 shows a sectional view similar to FIG. 5 wherein the side walls have been displaced to a position in which the walls are sufficiently spread apart to permit unloading of the component by an unloader.

FIG. 7 illustrates one method of removing a component 202 from the component-receiving area 40a that is similar to a method described above for loading a component 202 into the carrier tape 10. Downward forces $F_1$ and $F_2$ have been applied to each longitudinal edge surface 18 and 16 causing the side walls 22 and 21 to open. The downward forces $F_1$ and $F_2$ cause longitudinal edge surfaces 18 and 16, respectively, to shift downward from their original positions. The amount of downward shift for each longitudinal edge surface 18 and 16 is denoted by $P_1$ and $P_2$, respectively, in FIG. 7. Typically, the component-receiving area 40a rests on support surface 75 during deflection of side walls 21 and 22. The values of $\alpha'$ and $\beta'$ are sufficiently large to permit a component to be removed from component-receiving area 40a. Typically, the values of $\alpha'$ and $\beta'$ are 90 degrees in the component-removal position. The component 202 is lifted out of component-receiving area 40a by the unloader 210.

It is also possible to replace support surface 75 of FIG. 7 with a surface comprising a radius which causes the component-receiving area to bow upward. This in turn causes the side walls to flex open without the need for downward forces $F_1$ and $F_2$.

It is also possible to remove component 202 using a method similar to that illustrated in FIG. 3a where two arms 71a and 71b displace side walls 22 and 21, causing the side walls to flex open.

Alternatively, the strip portion 12 of the carrier tape 10 may include a hole 25 positioned in the bottom of each component-receiving area 40a to facilitate removal of each component using, for example, a mechanical push-up such as a poke-up needle.

Alternatively, a vacuum suction device may be used to lift the component 202 from the component-receiving area 40a.

Combinations of any of the above techniques may also be employed. For example, a vacuum suction device is commonly used with a mechanical push-up.

One particular embodiment of carrier tape 10 for a component that is 2.0 mm (length)×1.27 mm (width)×0.5 mm (height), commonly referred to as an "0805" chip, is specially described with reference to FIGS. 1, 2 and 4. For components this size, strip portion 12 is preferably 8 mm+3, −1 mm in width, to conform to standards established by the International Electrotechnical Commission (IEC), the Electronic Industries Association (EIA), the Japanese Industrial Standards (JIS), and other similar industrial standardization bodies. Other standard widths include 12 mm, 16 mm, 24 mm, 32 mm, 44 mm, and 56 mm. The height of each side wall 21 and 22 is preferably equal to or greater than 0.5 mm, the wall length is preferably 1.65 mm, and the values of $\alpha$ and $\beta$ are preferably the same and greater than 70 but less than 80 degrees. Each side wall 21 and 22 is preferably spaced from each adjacent wall 121 and 122, respectively, a distance that is equal to or greater than the thickness of strip portion 12, and the distance from the center of one component-receiving area to another is preferably equal to 4.0 mm. The thickness of each side wall 21 and 22 at the point where the wall and strip portion meet is preferably less than the thickness of strip portion 12. Holes 20 are preferably spaced at 4 mm increments. The components can be loaded into and removed from the carrier tape by employing downward forces $F_1$ and $F_2$ on longitudinal edge surfaces 18 and 16, respectively, as shown in FIG. 4 wherein the values of $P_1$ and $P_2$ are approximately 15 degrees.

Figure 8:
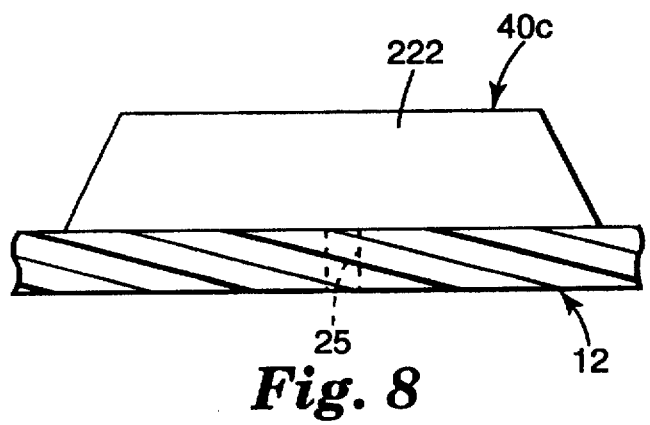
FIG. 8 is a sectional view taken along lines 8—8 of FIG. 1.
Figure 9:
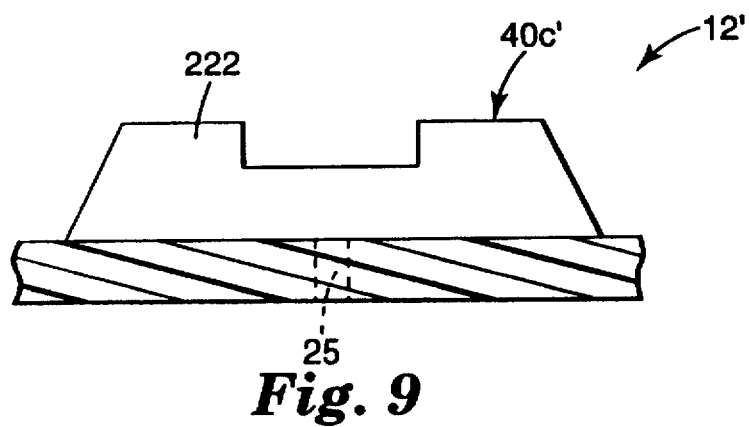
FIG. 9 is a sectional view similar to FIG. 8 wherein the side wall comprises a modified trapezoidal shape.

Side walls 21 and 22 can have a variety of shapes when viewed along line 8—8 of FIG. 1 as shown by FIGS. 8—9. FIG. 8 illustrates a trapezoidal side wall shape. FIG. 9 illustrates a modified trapezoidal shape wherein a portion of the trapezoid has been removed. It is contemplated that such complex shapes as shown is FIG. 9 would be particularly useful in securing a component having, for example, a raised portion that fits into the removed portion of the trapezoid. Such a configuration allows for specific orientation of the component into component-receiving area 40a.

Figure 10:
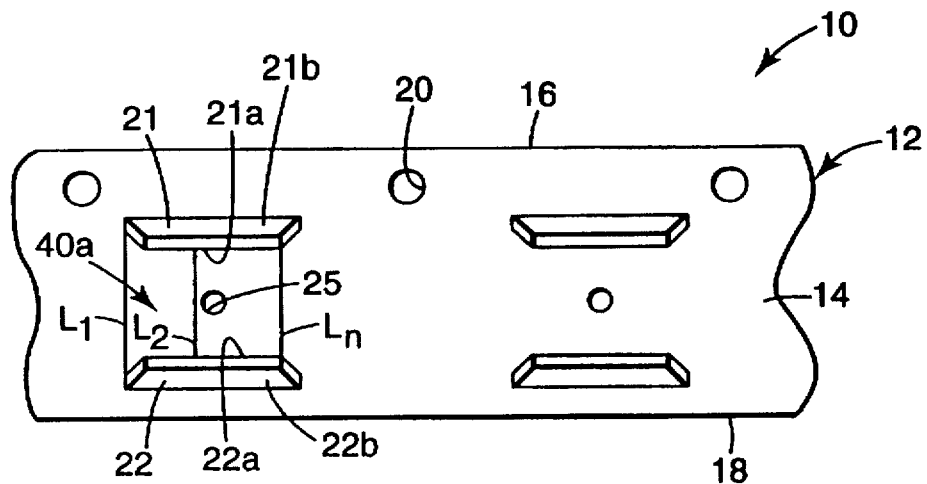
FIG. 10 is a fragmentary plan view of another embodiment of the carrier tape of the present invention wherein each side wall is substantially parallel to a longitudinal edge surface (i.e., forms an angle less than 10 degrees or greater than 170 degrees therewith)

The component-receiving area 40a can be designed to conform to the shape of the components that they are intended to receive. Examples of such shapes include circular, rectangular, oval, triangular, pentagonal, and the like. For example, FIG. 10 illustrates a preferred embodiment comprising a square component-receiving area 40a. In this preferred embodiment, side walls 21 and 22 are substantially parallel to longitudinal edge surfaces 16 and 18, i.e., the outer major surfaces of each side wall form angles between 0 and 10 degrees with a longitudinal edge surface. Preferably, the side walls 21 and 22 are positioned so that a line $L_1$ drawn perpendicularly to inner major surface 22a may be extended linearly so that it intersects inner major surface 21a. More preferably, all possible lines $L_1, L_2, \ldots L_n$ drawn perpendicular to inner major surface 22a intersect inner major surface 21a, in which case the two side walls may be described as being "directly opposite" one another.

Figure 11:
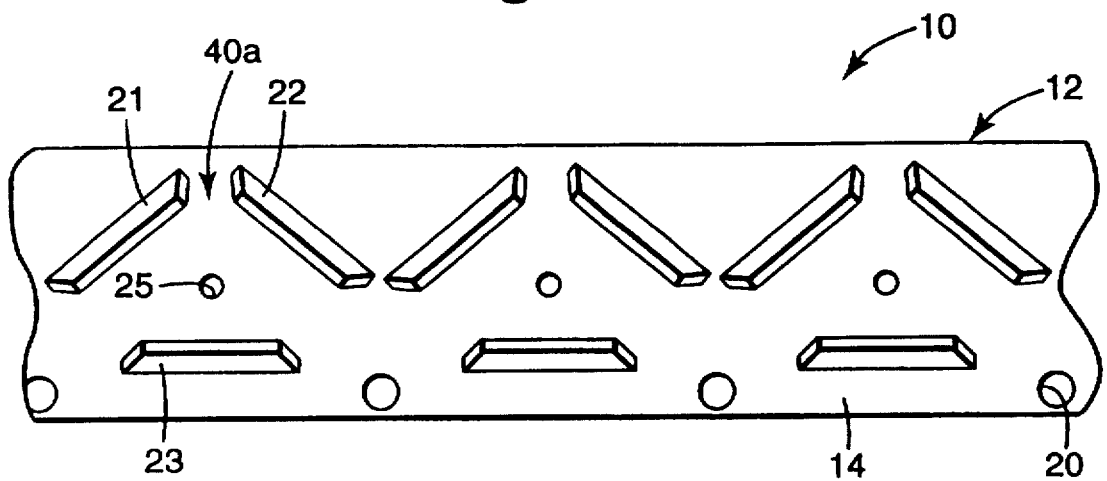
FIG. 11 is a fragmentary plan view of another embodiment of the carrier tape of the present invention wherein the side walls are present in a triangular configuration.

FIG. 11 illustrates a triangular component-receiving area 40a comprising three side walls 21, 22, and 23. This configuration is especially useful for transporting components that have a specific polygonal shape.

Figure 12:
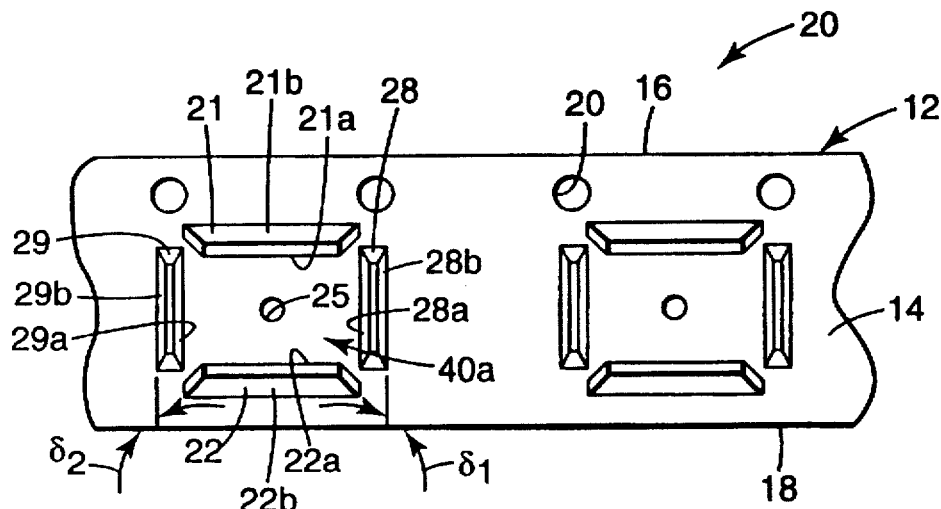
FIG. 12 is a fragmentary plan view of another embodiment of the carrier tape of the present invention that includes end walls in addition to side walls.

FIG. 12 illustrates another embodiment of the invention which comprises end walls 28 and 29 in addition to side walls 21 and 22. End walls 28 and 29 are spaced in the transverse direction of the carrier tape. End walls 28 and 29 are typically positioned outside of the side walls 21 and 22 as shown in FIG. 8, but may be spaced inside the area created by side walls 21 and 22. End wall 28 comprises inner major surface 28a and outer major surface 28b. Outer major surface 28b forms an angle $\delta_1$ with longitudinal edge 18. The value of $\delta_1$ is typically in the range of 45 to 135 degrees, inclusively. Similarly, end wall 29 comprises inner major surface 29a and outer major surface 29b. Outer major surface 29b forms an angle $\delta_2$ with longitudinal edge 18. Here again, the value of $\delta_2$ is also typically in the range of 45 to 135 degrees, inclusively. Preferably, the values of $\delta_1$ and $\delta_2$ are the same. More preferably, the values of $\delta_1$ and $\delta_2$ are in the range of 85 to 95 degrees in which case the end walls may be described as being substantially perpendicular to a longitudinal edge surface. The inner major surfaces 28a and 29a of end walls 28 and 29, respectively, may be inclined inwardly toward or outwardly away from the center of the component-receiving area. For example, inner major surfaces 28a and 29a may form angles greater than 0 degrees but less than 90 degrees with the component-receiving surface 14 of the carrier tape. Alternatively, the inner major surfaces 28a and 29a of end walls 28 and 29 may be substantially perpendicular with the component-receiving surface 14 of the carrier tape (i.e., form an angle between 85 and 95 degrees therewith). As described above for side walls 21 and 22, end walls 28 and 29 may have a variety of shapes when viewed from the side. Furthermore, the height of end walls 28 and 29 can be the same or different than that of side walls 21 and 22. For example, end walls 28 and 29 can be shorter or taller than side walls 21 and 22. End walls 28 and 29 may be advantageously used to provide additional security against movement of the components, especially movement in the longitudinal direction of the tape.

Figure 13:
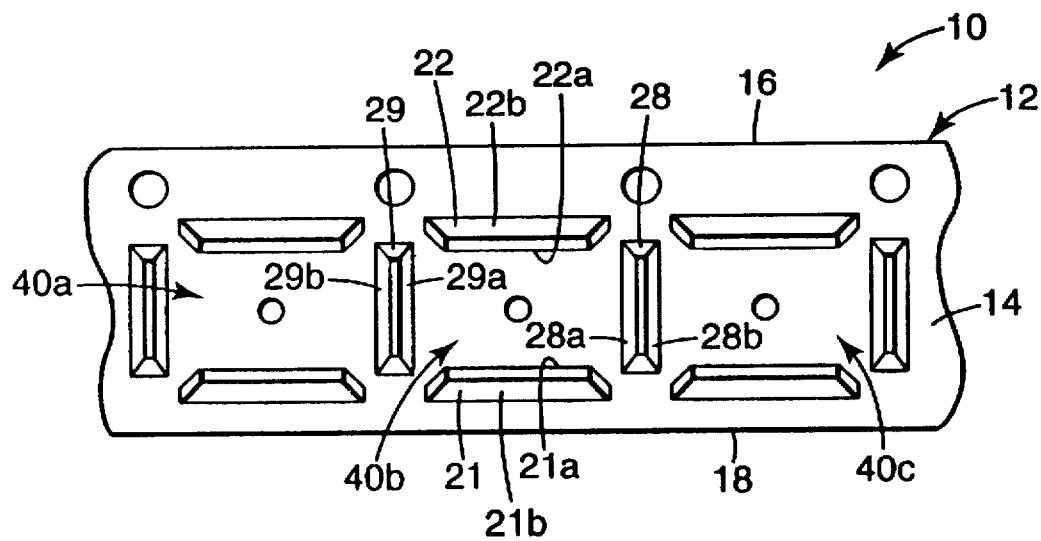
FIG. 13 is a fragmentary plan view of another embodiment of the carrier tape of the present invention that includes end walls in addition to side walls, wherein the end walls are shared by component-receiving areas.

FIG. 13 shows another embodiment of the carrier tape of the invention comprising end walls 28 and 29 in addition to side walls 21 and 22. In this embodiment, the end walls 28 and 29 are shared by component-receiving areas. For example, end wall 28 serves as an end wall to both component-receiving areas 40b and 40c. Similarly, end wall 29 serves as an end wall to both component-receiving areas 40a and 40b. End walls 28 and 29 are typically spaced outside of the side walls 21 and 22 as shown in FIG. 13. This configuration allows for efficient storage of a maximum number of components along the length of the carrier tape 10.

Figure 14:
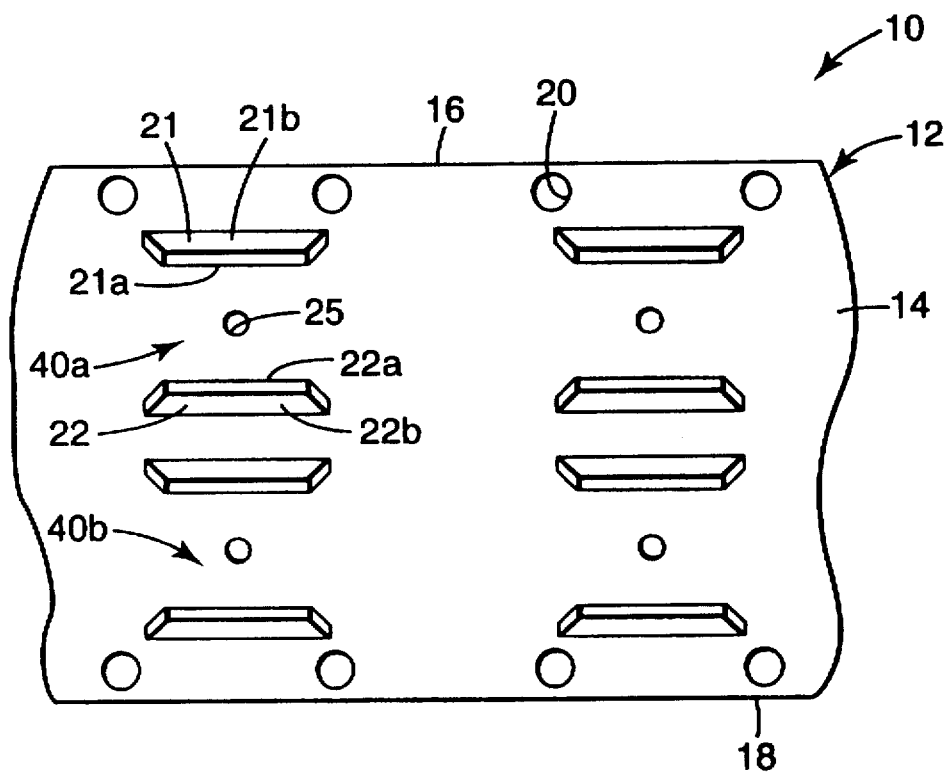
FIG. 14 is a fragmentary plan view of another embodiment of the carrier tape of the present invention wherein two rows of component-receiving areas are provided.

Two or more columns of component-receiving areas 40 can also be formed along the length of carrier tape 10 to facilitate the transportation of more than one row of components, as shown in FIG. 14. This can be accomplished by providing an additional series of component-receiving areas spaced adjacent to the first series of component-receiving areas. When two or more columns of component-receiving areas are provided on a single carrier tape, the multiple columns are preferably arranged parallel to each other with the series of walls in one column being parallel to and directly opposite the series of walls in another column.

The strip portion 12 may be prepared from a wide variety of polymeric materials, including (but not limited to) polyester, polycarbonate, polypropylene, impact modified polystyrene, high density polyethylene, and the like. Such materials generally provide improved resistance to dimensional changes caused by fluctuations in humidity compared to paper substrates. Preferably, the strip portion 12 is prepared from a material that can withstand a modest radial displacement with full recovery to its original position. This enables the provision of side walls that can be deflected (for example, to remove a component) without cracking or permanent deformation. Preferred materials for preparing the carrier tape of the invention include polypropylene and unfilled polycarbonate. The polymeric material may be made electrically dissipative by using an electrically conductive material. The electrically conductive material (for example, carbon black) may be dispersed within the polymeric material or coated onto the polymeric material. The inclusion of such an electrically conductive material may prevent damage to components that are contained in the carrier tape through dissipation of any electrostatic charge.

Carrier tape 10 is preferably unitary and may be made by thermoforming walls 21 and 22. The manufacture of carrier tapes using thermoforming techniques advantageously avoids the production of particulate matter that is commonly associated with the manufacture of punched carrier tapes. Thermoforming is a process that relies on the use of both heat and pressure to deform a thermoplastic material such as a polymeric web. The heat may be provided by a mold itself, a preheater, or an extruder. In any event, a polymeric web is heated sufficiently to permit thermoforming, which occurs at a temperature above the polymer's glass transition temperature. The actual temperature to which the polymeric web must be heated varies over a broad range (i.e., about 200°–370° F.) depending on the gauge and type of material that is being thermoformed as well as the speed of the manufacturing line. The applied pressure is sufficient to permit a high quality replication of the mold or die pattern and may be provided by, for example, the force the mold exerts upon the web when the mold closes or by the application of a vacuum that urges the web to deform over a male die or draws the web into a female die (i.e., vacuum thermoforming). The web is typically cooled after thermoforming, which can be accomplished by air cooling, fans, a water bath or a cooling oven until the thermoplastic polymer hardens.

In general, thermoforming is a process that is familiar to those of ordinary skill in the art and is described in various references such as *Encyclopedia of Polymer Science and Engineering*, volume 16, second edition, published by John Wiley & Sons, 1989, which discusses different thermoforming processes and the use of roll-fed, sheet-fed, in-line extrusion, and continuous web-fed systems. All of these can be employed to manufacture the carrier tapes of the invention, as can different thermoforming tools that are described in the technical literature, such as flat forming and rotary devices, these devices being available for use with various thermoforming techniques such as matched mold forming, plug-assist forming, basic vacuum forming, and pressure forming. The thermoformed carrier tape may then be subjected to other processing steps, such as punching advancement holes along at least one edge surface of the tape.

Alternatively, carrier tape 10 may be a tape comprised of separate wall structures attached to surface 14. The walls may be attached to the carrier tape by any known attachment method, such as adhesively or by ultrasonic bonding processes.

While not required, an adhesive layer may be applied to the component-receiving area 40a of the carrier tape of the present invention to provide additional security against movement of the components. Preferred adhesive compositions are pressure sensitive adhesive (PSA) compositions of the type that display sufficiently aggressive tackiness to a wide variety of substrates after application of only light pressure. Examples of PSAs include acrylic adhesives, rubber-based adhesives, and tackified block copolymers. Preferably, the adhesive does not leave an adhesive residue on the component after it is removed from the carrier tape. It is also preferred that the adhesive be both non-contaminating and non-corrosive to the components. The amount of adhesive used on the carrier tape may vary over a wide range and may be influenced by the size and weight of the component to be secured in the component-receiving area.

The carrier tape 10 of the present invention may be conveniently wound around a core of a reel for subsequent storage and transportation. Preferably, when the carrier tape is to be wound around a core, the outer major surface 21b or 22b of each side wall 21 and 22 forms an angle $\phi_1$ or $\phi_2$, respectively, that is less than 45 degrees or greater than 135 degrees with a longitudinal edge surface of the tape. In this case, the inwardly inclined inner major surfaces 21a and 22a of the side walls 21 and 22 have a slight tendency to further bend inwardly due to the forces that result from winding the carrier tape. This advantageously allows the components to be snugly stored in the component-receiving areas without shifting or falling out of the carrier tape.

While the carrier tapes of the present invention are particularly useful in the electronics industry for transporting and delivering surface mount electronic components (such as memory chips, integrated circuit chips, resistors, connectors, microprocessors, capacitors, gate arrays, and the like), the carrier tapes may be used to transport other components such as watch springs, small screws, surface mount electronic component shields, and the like.

The present invention has now been described with reference to several embodiments thereof It will be apparent to those skilled in the art that many changes can be made to the embodiments described without departing from the scope of the invention. Hence, the scope of the present invention shall not be limited by the structures described herein, but only by the structures described by the language of the claims and the equivalents thereof.

The embodiments for which an exclusive property or privilege is claimed are defined as follows:

1. An elongated flexible carrier tape for transporting at least one component, the carrier tape having a length and comprising:

a planar strip portion comprising a planar component-receiving surface and first and second longitudinal edge surfaces;

at least two side walls longitudinally disposed along the length of the carrier tape and extending upwardly from the component-receiving surface between the first and second longitudinal edge surfaces, wherein each of the at least two side walls comprises an inner major surface; and at least one planar component-receiving area comprising an area of the strip portion bordered by the at least two side walls;

at least one of the side walls being inclined inwardly toward the at least one component-receiving area forming an angle greater than 0 degrees but less than 90 degrees with the component-receiving surface of the carrier tape, wherein the at least one inclined side wall comprises a first end attached to the component-receiving surface and a second end spaced from the component-receiving surface and wherein the at least one inclined side wall is substantially planar between the first and second ends of the at least one inclined side wall, the inner major surface of the at least one inclined side wall and the inner major surface of at least one other side wall being capable of contacting a component inserted into the at least one component-receiving area to secure the component within the component-receiving area, the at least one inclined side wall being capable of being displaced to a position that allows a component to be inserted into the at least one component-receiving area, with subsequent recovery to a component-securing position, the at least one inclined side wall further being capable of being displaced from the component-securing position to a position that allows for removal of the component from the at least one component-receiving area.

2. An elongated flexible carrier tape according to claim 1 wherein each of the at least two side walls is inclined inwardly toward the component-receiving area so that the inner major surface of each of the side walls forms an angle greater than 0 degrees but less than 90 degrees with the component-receiving surface of the carrier tape.

3. An elongated flexible carrier tape according to claim 1 wherein the inner major surface of the at least one inclined side wall forms an angle greater than 45 degrees but less than 90 degrees with the component-receiving surface of the carrier tape.

4. An elongated flexible carrier tape according to claim 1 wherein the inner major surface of the at least one inclined side wall forms an angle greater than 60 degrees but less than 90 degrees with the component-receiving surface of the carrier tape.

5. An elongated flexible carrier tape according to claim 1 wherein the inner major surface of the at least one inclined side wall forms an angle greater than 80 degrees but less than 90 degrees with the component-receiving surface of the carrier tape.

6. An elongated flexible carrier tape according to claim 1 wherein each of the at least two side walls further comprises an outer major surface, each of the outer major surfaces forming an angle less than 45 degrees or greater than 135 degrees with a longitudinal edge surface.

7. An elongated flexible carrier tape according to claim 1 wherein the at least two side walls are substantially parallel with a longitudinal edge surface.

8. An elongated flexible carrier tape according to claim 1 wherein the at least two side walls are directly opposite one another.

9. An elongated flexible carrier tape according to claim 1 additionally comprising a hole through the strip portion positioned within the at least one component-receiving area.

10. An elongated flexible carrier tape according to claim 1 wherein the at least one component-receiving area contains a component.

11. An elongated flexible carrier tape according to claim 1 wherein the strip portion further comprises a means for advancing the carrier tape by an advancement mechanism.

12. An elongated flexible carrier tape according to claim 1 wherein the carrier tape is electrically dissipative.

13. An elongated flexible carrier tape according to claim 1 wherein the flexible carrier tape is a unitary tape.

14. An elongated flexible carrier tape according to claim 1 comprising a material selected from the group consisting of polypropylene and unfilled polycarbonate.

15. An elongated flexible carrier tape according to claim 1 comprising a plurality of pairs of side walls, each pair forming a component-receiving area.

16. An elongated flexible carrier tape according to claim 15 wherein a plurality of components are secured therein.

17. The carrier tape of claim 1 wherein the carrier tape is wound about the core of a reel.

18. An elongated flexible carrier tape for transporting at least one component, the carrier tape having a length and comprising:

a planar strip portion comprising a planar component-receiving surface and first and second longitudinal edge surfaces;

at least two side walls longitudinally disposed along the length of the carrier tape and extending upwardly from the component-receiving surface between the first and second longitudinal edge surfaces; and at least one planar component-receiving area comprising an area of the strip portion bordered by the at least two side walls;

at least one of the side walls being inclined inwardly toward the at least one component-receiving area forming an angle greater than 0 degrees but less than 90 degrees with the component-receiving surface of the carrier tape, wherein the at least one inclined side wall comprises a first end attached to the component-receiving surface and a second end spaced from the component-receiving surface and wherein the at least one inclined side wall is substantially planar between the first and second ends of the at least one inclined side wall, the at least one inclined side wall being capable of being displaced to a position that allows a component to be inserted into the at least one component-receiving area, with subsequent recovery to a component-securing position, the at least one inclined side wall further being capable of being displaced from the component-securing position to a position that allows for removal of the component from the at least one component-receiving area, wherein the component-receiving area comprises an area of the strip portion bordered by at least one end wall in addition to the at least two side walls.

19. An elongated flexible carrier tape according to claim 18 wherein the at least one end wall is substantially perpendicular to the component-receiving surface of the carrier tape.

20. A method of securing at least one component into a carrier tape without the need for a cover tape or adhesive, the method comprising the steps of:

(a) providing a carrier tape having a length and comprising:

a planar strip portion comprising a planar component-receiving surface and first and second longitudinal edge surfaces;

at least two side walls longitudinally disposed along the length of the carrier tape and extending upwardly from the component-receiving surface between the first and second longitudinal edge surfaces, wherein each of the at least two side walls comprises an inner major surface; and at least one planar component-receiving area comprising an area of the strip portion bordered by the at least two side walls;

at least one of the side walls being inclined inwardly toward the at least one component-receiving area forming an angle greater than 0 degrees but less than 90 degrees with the component-receiving surface of the carrier tape, wherein the at least one inclined side wall comprises a first end attached to the component-receiving surface and a second end spaced from the component-receiving surface and wherein the at least one inclined side wall is substantially planar between the first and second ends of the at least one inclined side wall;

(b) displacing the at least one inclined side wall to a position that allows a component to be inserted into the at least one component-receiving area;

(c) placing at least one component in the at least one component-receiving area; and (d) allowing the displaced side wall to recover to a component-securing position so that the inner major surface of the at least one inclined side wall and the inner major surface of at least one other side wall contact the at least one component to secure the component within the component-receiving area.

21. The method of claim 20, further including the step of winding the carrier tape around a core for storage and transporting thereof.

22. A method of removing at least one component from a loaded carrier tape, said method comprising the steps of:

(a) providing a loaded carrier tape, the carrier tape having a length and comprising:

a planar strip portion comprising a planar component-receiving surface and first and second longitudinal edge surfaces;

at least two side walls longitudinally disposed along the length of the carrier tape and extending upwardly from the component-receiving surface between the first and second longitudinal edge surfaces;

at least one planar component-receiving area comprising an area of the strip portion bordered by the at least two side walls wherein each of the at least two side walls comprises an inner major surface, and a component in the at least one component-receiving area, at least one of the at least two side walls being inclined inwardly toward the component-receiving area, forming an angle greater than 0 degrees but less than 90 degrees with the component-receiving surface of the carrier tape, wherein the at least one inclined side wall comprises a first end attached to the component-receiving surface and a second end spaced from the component-receiving surface and wherein the at least one inclined side wall is substantially planar between the first and second ends of the at least one inclined side wall, the component residing under at least a portion of the at least one inclined side wall and secured within the component-receiving area by the inner major surface of the at least one inclined side wall, (b) displacing the at least one inclined side wall to a position that allows the component to be removed from the at least one component-receiving area; and (c) removing the component from the at least one component-receiving area.

23. An elongated flexible carrier tape for transporting at least one component, the carrier tape having a length and comprising:

a planar strip portion comprising a planar component-receiving surface and first and second longitudinal edge surfaces; and at least two side walls longitudinally disposed along the length of the carrier tape and extending upwardly from the component-receiving surface between the first and second longitudinal edge surfaces, the at least two side walls being directly opposite each other and substantially parallel to a longitudinal edge;

at least one end wall positioned in the transverse direction of the carrier tape so that it is substantially perpendicular to a longitudinal edge surface;

at least one planar component-receiving area comprising an area of the strip portion bordered by the at least two side walls and the at least one end wall;

each of the two side walls being inclined inwardly toward the at least one component-receiving area forming an angle greater than 60 degrees but less than 90 degrees with the component-receiving surface of the carrier tape and capable of being displaced to a position that allows a component to be inserted into the at least one component-receiving area, with subsequent recovery to a component-securing position, each of the two side walls further being capable of being displaced from the component-securing position to a position that allows for removal of the component from the at least one component-receiving area.

24. An elongated flexible carrier tape for transporting at least one component, the carrier tape having a length and comprising:

a planar strip portion comprising a planar component-receiving surface and first and second longitudinal edge surfaces;

at least two side walls longitudinally disposed along the length of the carrier tape and extending upwardly from the component-receiving surface between the first and second longitudinal edge surfaces, wherein each of the at least two side walls comprises a first end attached to the component-receiving surface, a second end spaced from the component-receiving surface, and an intermediate portion between the first and second ends; and at least one planar component-receiving area comprising an area of the strip portion bordered by the at least two side walls;

at least one of the side walls being inclined inwardly toward the at least one component-receiving area forming an angle greater than 0 degrees but less than 90 degrees with the component-receiving surface of the carrier tape, wherein the at least one inclined side wall is substantially planar between the first and second ends of the at least one inclined side wall, the intermediate portion of the at least one inclined side wall and the intermediate portion of at least one other side wall being capable of contacting a component inserted into the at least one component-receiving area to secure the component within the component-receiving area, the at least one inclined side wall being capable of being displaced to a position that allows a component to be inserted into the at least one component-receiving area, with subsequent recovery to a component-securing position, the at least one inclined side wall further being capable of being displaced from the component-securing position to a position that allows for removal of the component from the at least one component-receiving area.

\* \* \* \* \*